United States Patent
Hou et al.

(10) Patent No.: US 12,014,004 B2
(45) Date of Patent: *Jun. 18, 2024

(54) TOUCH CONTROL METHOD, CIRCUIT SYSTEM, AND TOUCH DEVICE

(71) Applicant: FocalTech Electronics (Shenzhen) Co., Ltd., Shenzhen (CN)

(72) Inventors: Wei-Jing Hou, Guangdong (CN); Jian-Wu Chen, Guangdong (CN); Hui-Dan Xiao, Guangdong (CN); Da-Chun Wu, Guangdong (CN); Zhen-Huan Mou, Guangdong (CN); You-Gang Gong, Guangdong (CN); Guan-Qun Pan, Guangdong (CN)

(73) Assignee: FocalTech Electronics (Shenzhen) Co., Ltd., Shenzhen (CN)

( * ) Notice: Subject to any disclaimer, the term of this patent is extended or adjusted under 35 U.S.C. 154(b) by 362 days.

This patent is subject to a terminal disclaimer.

(21) Appl. No.: 17/434,098

(22) PCT Filed: Feb. 26, 2020

(86) PCT No.: PCT/CN2020/076833
§ 371 (c)(1),
(2) Date: Aug. 26, 2021

(87) PCT Pub. No.: WO2020/173468
PCT Pub. Date: Sep. 3, 2020

(65) Prior Publication Data
US 2022/0137776 A1    May 5, 2022

(30) Foreign Application Priority Data

Feb. 26, 2019 (CN) .................. 201910142832.X

(51) Int. Cl.
*G06F 3/041* (2006.01)
*G06F 3/044* (2006.01)
*H03K 17/96* (2006.01)

(52) U.S. Cl.
CPC .......... *G06F 3/04166* (2019.05); *G06F 3/044* (2013.01); *H03K 17/962* (2013.01)

(58) Field of Classification Search
None
See application file for complete search history.

(56) References Cited

U.S. PATENT DOCUMENTS 8,294,687 B1 * 10/2012 Ksondzyk ............... G06F 3/044
                                                        345/157
10,474,281 B2 * 11/2019 Park ...................... G06F 3/0412
(Continued)

FOREIGN PATENT DOCUMENTS

CN          105739794 A      7/2016
TW          201738705 A      11/2017
WO     WO-2014006904 A1 *   1/2014    ............. G06F 3/044

*Primary Examiner* — Jermele M Hollington
(74) *Attorney, Agent, or Firm* — ScienBiziP, P.C.

(57) ABSTRACT

A touch control method, a touch control circuit system, and a touch device, the touch device includes a plurality of touch electrodes, the touch control method includes: step S1, sending a scanning signal to the plurality of touch electrodes; step S2, acquiring first touch data and second touch data according to the scanning signal; and step S3, the touch device defining a plurality of touch nodes, each of the plurality of touch nodes corresponding to the first touch data and the second touch data, defining at least one target touch node according to a difference between the first touch data and the second touch data, and calculating a current touch position according to the first touch data and the second touch data of the at least one target touch node.

22 Claims, 10 Drawing Sheets

(56) References Cited

U.S. PATENT DOCUMENTS

| | | | |
|---|---|---|---|
| 11,269,441 B2* | 3/2022 | Kim | G06F 3/0416 |
| 11,481,065 B2* | 10/2022 | Kim | G06F 3/044 |
| 11,579,726 B2* | 2/2023 | Feng | G06F 3/04166 |
| 11,934,610 B2* | 3/2024 | Hou | G06F 3/04166 |
| 2012/0299842 A1* | 11/2012 | Liu | G06F 3/0445 |
| | | | 345/173 |
| 2014/0375606 A1* | 12/2014 | Abe | G02F 1/1368 |
| | | | 345/87 |
| 2017/0212635 A1* | 7/2017 | Cordeiro | G06F 3/04182 |
| 2017/0242529 A1* | 8/2017 | Park | G09G 3/20 |
| 2017/0262116 A1* | 9/2017 | Zuo | G06F 3/041661 |
| 2022/0137775 A1* | 5/2022 | Hou | G06F 3/04166 |
| | | | 345/174 |
| 2022/0137776 A1* | 5/2022 | Hou | H03K 17/9622 |
| | | | 324/600 |

* cited by examiner

Calculating a detection capacitance difference between a first detection capacitance and a second detection capacitance of each of the plurality of touch nodes, wherein the first touch data comprises the first detection capacitance and the second touch data comprises the second detection capacitance ⎯ S31

Setting a difference threshold, defining the touch node corresponding to the detection capacitance difference being less than the difference threshold as the target touch node, and defining the touch node corresponding to the detection capacitance difference being greater than the difference threshold as the target touch node ⎯ S32

Calculating the current touch position according to the first detection capacitance and the second detection capacitance corresponding to the target touch node ⎯ S33

FIG. 12

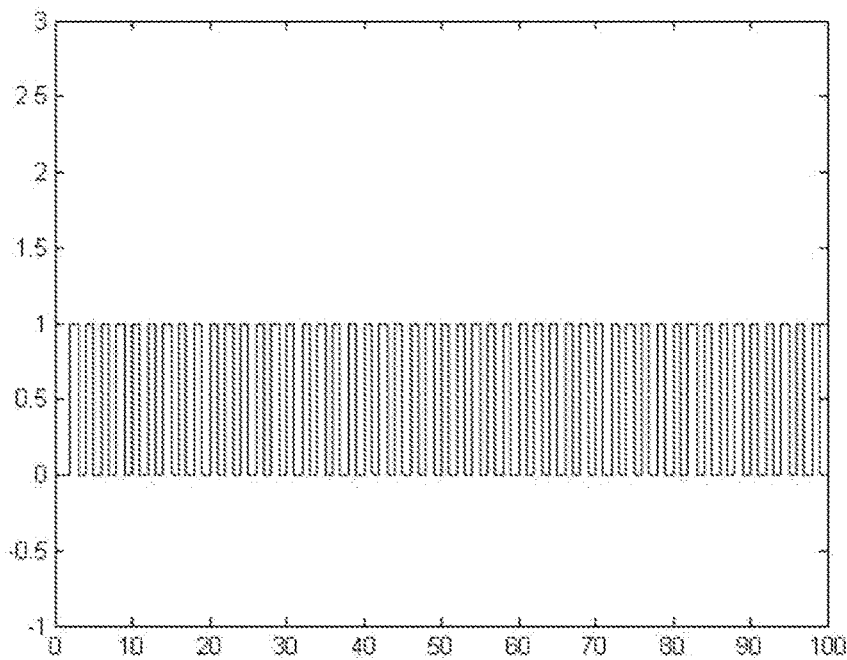

FIG. 13

TOUCH CONTROL METHOD, CIRCUIT SYSTEM, AND TOUCH DEVICE

TECHNICAL FIELD

The present disclosure generally relates to touch technology, particularly relates to a touch control method, a circuit system, and a touch device.

BACKGROUND

Touch technology is widely used in products such as smart phones, smart computers, smart wearable products, and smart homes etc. With a diversification of application scenarios of the products described above, an adaptability of the touch technology in various application scenarios is challenged.

In recent years, a widely used touch technology is capacitive touch principle (that is, when a finger is placed on a touch area of a device, a capacitance value of the touch area close to the finger will change, wherein a touch position of the finger can be determined by detecting a position where the capacitance value changes). However, the capacitive touch principle is easily affected by water.

Please refer to FIG. 1, a touch structure shown in FIG. 1 is a mutual-capacitive touch structure, which includes a protection cover 41, a touch driving electrode TX and a touch sensing electrode RX. A coupling capacitance Cm is formed between adjacent touch driving electrode TX and touch sensing electrode RX. When the finger touches the protection cover 41, since an electric potential of the finger is approximately the ground potential, electric potential of the touch driving electrode TX and the touch sensing electrode RX are both higher than the electric potential of the finger, and an electrical coupling is formed between the touch sensing electrode RX, the touch driving electrode TX, and the finger, which means a coupling capacitance $C_{FT}$ is formed between the touch driving electrode TX and the finger, and a coupling capacitance $C_{FR}$ is formed between the touch sensing electrode RX and the finger. When an excitation signal is applied to the touch drive electrode TX, a current flow through the coupling capacitance Cm to the touch sensing electrode Rx is partly shunted by the coupling capacitance $C_{FT}$ and the coupling capacitance $C_{FR}$, which reduces the current flowing through the touch sensing electrode Rx. That is equivalent to a reduction in the coupling capacitance Cm. Therefore, a finger touch usually reduces a coupling capacitance between adjacent touch driving electrode TX and touch sensing electrode RX.

Please refer to FIG. 2, FIG. 2 shows a touch structure same as FIG. 1. When the protective cover 41 is covered by water droplets, the water droplets will also change an electric field coupling between the touch driving electrode TX and the touch sensing electrode RX since the water droplets are conductors. However, a capacitance between the water droplets and the ground is almost zero because a surface area of the water droplets is much smaller than that of a human body. A touch electrode "A" is grounding when not in a scanning state, wherein a capacitance $C_{WG}$ to the ground is formed between the water droplets and the touch electrode "A", and an electric potential of the water droplets is approximately the ground potential. When the protection cover 41 is covered with the water droplets, a coupling capacitance $C_{WT}$ is formed between the water droplets and the touch driving electrode TX, and a coupling capacitance $C_{WR}$ is formed between the water droplets and the touch sensing electrode RX. When the excitation signal is applied to the touch driving electrode TX, a current flow through the coupling capacitance Cm to the touch sensing electrode Rx is partly shunted by the coupling capacitance $C_{WT}$ and the coupling capacitance $C_{WR}$, which reduces the current flowing through the touch sensing electrode Rx. That is equivalent to a reduction in the coupling capacitance Cm. It can be seen that impact of the water droplets on the protection cover 41 on touch data is similar to that of the finger, which is hard to distinguish whether a touch is caused by the finger or the water droplets.

It can be seen from the above that the water droplets change a distribution and a state of the coupling capacitance of the touch structure, which makes it more difficult to recognize the finger and process position data, which causes decreasing accuracy of a touch position or rendering a touch function valueless. However, the products described above are usually affected by water in the application scenarios, which causes the touch function to be valueless and brings many inconveniences to users. The problem above needs to be solved urgently.

SUMMARY

In view of the above problems, it is necessary to provide a touch control method with waterproof effect.

One aspect of the present disclosure provides a touch control method applied to a touch device, the touch device comprising a plurality of touch electrodes, the driving method comprising:

step S1, sending a scanning signal to the plurality of touch electrodes, the scanning signal being a multi-frequency scanning signal;

step S2, acquiring first touch data and second touch data according to the scanning signal, the first touch data and the second touch data being respectively acquired when scanning the plurality of touch electrodes with the scanning signal of different frequencies; and step S3, the touch device defining a plurality of touch nodes, each of the plurality of touch nodes corresponding to one of the first touch data and one of the second touch data, defining at least one target touch node according to a difference between the first touch data and the second touch data, and calculating a current touch position according to the first touch data and the second touch data of the at least one target touch node.

Another aspect of the present disclosure provides a touch control method applied to a touch device, the touch device comprising a plurality of touch electrodes, the touch control method comprising:

step S1, sending a scanning signal to the plurality of touch electrodes, wherein the scanning signal is a single-frequency non-sine wave scanning signal;

step S2: acquiring second original sensing data according to the single-frequency non-sine wave scanning signal, the single-frequency non-sine wave scanning signal can be decomposed into a fundamental wave and one harmonic wave, separating the second original sensing data into first touch data corresponding to the fundamental wave and second touch data corresponding to the one ha ionic wave; and step S3, the touch device defining a plurality of touch nodes, each of the plurality of touch nodes corresponding to the first touch data and the second touch data, defining at least one target touch node according to a difference between the first touch data and the second touch data, and calculating a current touch position according to the first touch data and the second touch data of the at least one target touch node.

Another aspect of the present disclosure provides a touch control circuit system applied to a touch device, the touch device comprising a plurality of touch electrodes, the touch control circuit system comprising:

a scanning signal sending module electrically connected to the plurality of touch electrodes and configured to send a scanning signal to all or parts of the plurality of touch electrodes, wherein the scanning signal is a multi-frequency scanning signal or a single-frequency non-sine wave scanning signal;

a touch data acquisition module electrically connected to the plurality of touch electrodes and configured to acquire first touch data and second data touch data according to the scanning signal, the first touch data and the second touch data are acquired when scanning the plurality of touch electrodes with the scanning signal of different frequencies; and a calculation module electrically connected to the touch data acquisition module, the touch device defining a plurality of touch nodes, each of the plurality of touch nodes corresponding to the first touch data and the second touch data, the calculation module being configured to define at least one target touch node according to a difference between the first touch and the second touch data corresponding to the at least one target touch node, and calculate a current touch position according to the first touch data and the second touch data corresponding to the at least one target touch node.

Another aspect of the present disclosure provides a touch device comprising a touch control circuit system described above.

The touch control method provided by the present embodiment obtains the first touch data and the second touch data respectively by scanning the touch electrodes with a first scanning signal of a first frequency and a second scanning signal of a second frequency. By using characteristics that a conductivity difference of scanning signals with different frequencies in a finger is smaller than that in water droplets, whether an initial coupling capacitance change on each touch node is caused by the finger or the water droplets can be judged according to a difference between the first touch data and the second touch data. Thus, the initial coupling capacitance change caused by the water droplets can be eliminated, a current touch position can be calculated only according to the initial coupling capacitance change caused by the finger. The above method is conducive to improve a problem that water droplets affect a touch function. The touch control method provided in the present disclosure can be applied to a touch device to enhance waterproof and moisture-proof properties of the touch device, which makes the touch function can work normally even the touch device is used in wet or water-existing scenes.

BRIEF DESCRIPTION OF DRAWINGS

FIG. 12 is a flow chart of detailed steps of step S3 in FIG. 5.

FIG. 13 is a waveform diagram of a first scanning signal.

| Step | S1, S2, S3, S11, S12, S21, S22, S31, S32, S33 |
|---|---|
| Protection cover | 41 |
| Touch-driving electrode | TX, TX1, TX2, TX3 . . . TXn |
| Touch-sensing electrode | RX, RX1, RX2, RX3 . . . RXn |
| Coupling capacitance | Cm, CFT, CFR, CWT, CWR |
| Capacitance to ground | CWG |
| Potential | GND |
| Touch device | 10, 30 |
| Touch electrode | A, 11 |
| cover | 14 |
| touch electrode layer | 13 |
| Touch IC | 12 |
| Finger | 20 |
| Times | M |
| Touch node | (TX1, RX1), (TX1, RX2), (TX1, RX3), (TX2, RX1), (TX2, RX2), (TX2, RX3), (TX3, RX1), (TX3, RX2), (TX3, RX3) . . . (TXn, RXn) |
| First detection capacitance | CM1 |
| Second detection capacitance | CM2 |
| Detection capacitance difference | ΔCM |
| Touch control circuit system | 31 |
| Scanning signal sending module | 311 |
| Touch data acquisition module | 312 |
| Calculating module | 312 |
| Switching system | 37 |
| Instruction receiving module | 321 |
| Switching module | 322 |

The following specific embodiments will further illustrate the present disclosure in conjunction with the above drawings.

DETAILED DESCRIPTION

Embodiment 1

Figure 1:
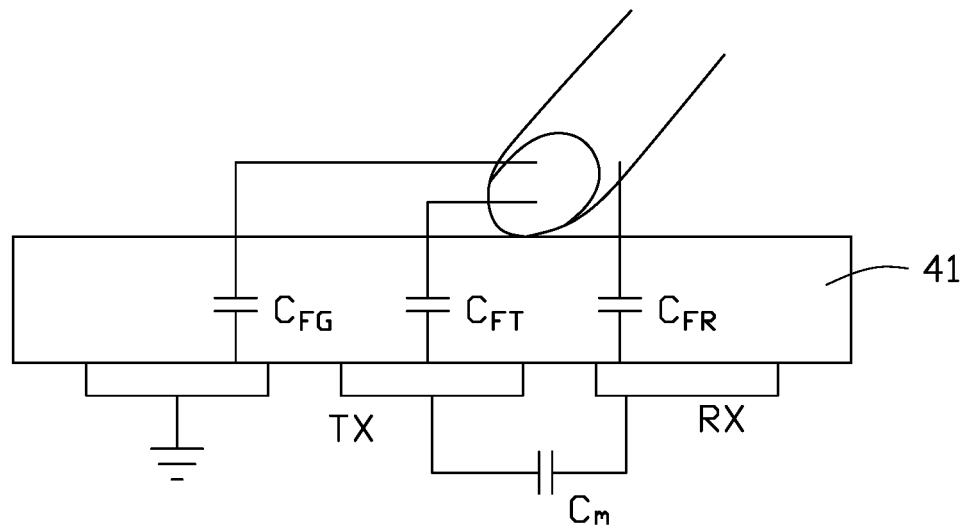
FIG. 1 is a schematic diagram of capacitance changes caused by a finger touching a capacitive touch structure in prior art.
Figure 2:
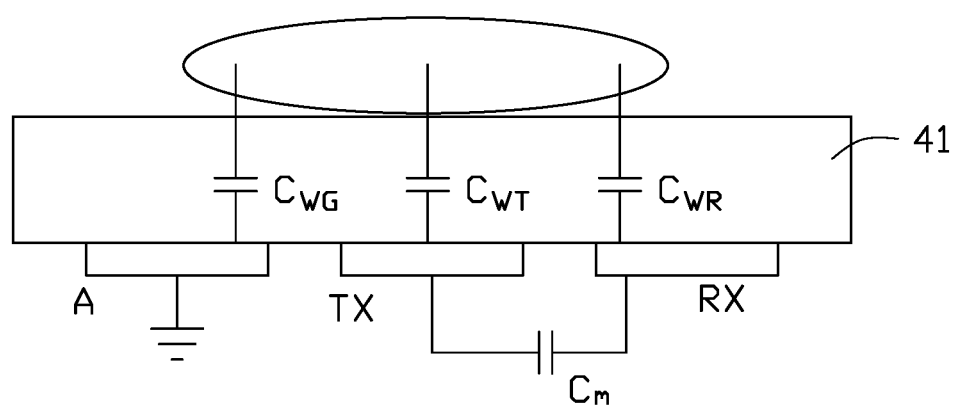
FIG. 2 is a schematic diagram of capacitance changes caused by water droplets covering the capacitive touch structure in prior art.
Figure 3:
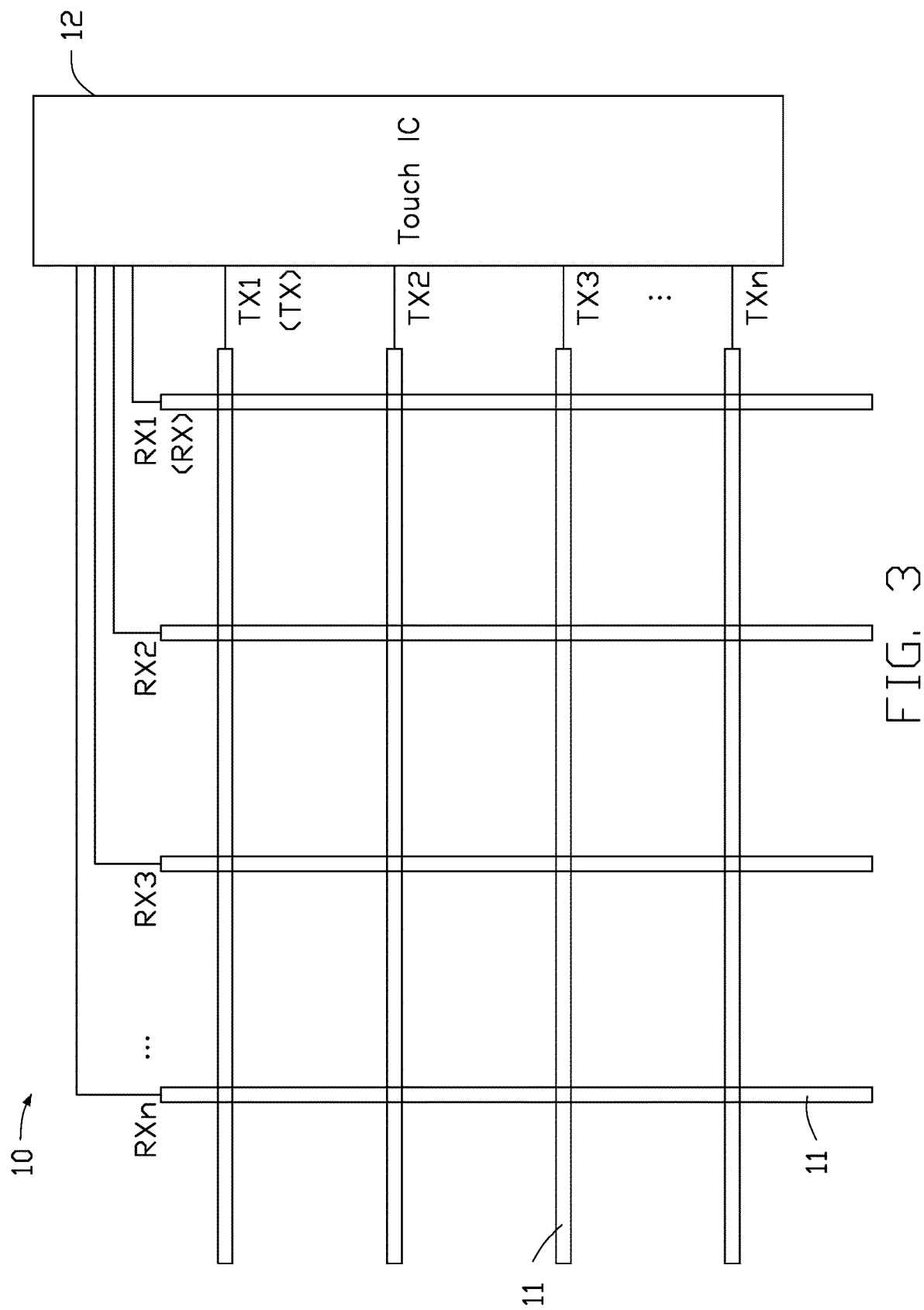
FIG. 3 is a schematic diagram of a structure of a touch device in a first embodiment.

Please refer to FIG. 3, a touch control method provided by the present embodiment is applied to a touch device 10 (FIG.

3 only shows structures of the touch device 10 related to the present embodiment). The touch device 10 includes a plurality of touch electrodes 11 and a touch chip 12 (touch IC in FIG. 3, referred to as touch IC 12 hereinafter) electrically connected to each of the touch electrodes 11. The plurality of touch electrodes 11 are not limited to transparent or opaque conductive materials such as indium tin oxide, metal mesh, nano silver, and graphene. In the present embodiment, the touch device 10 is a mutual-capacitive touch device. Each of the touch electrode 11 is strip shaped. Parts of the touch electrodes 11 are as touch driving electrodes TX (including TX1, TX2, TX3 . . . TXn), the other part of the touch electrodes 11 are as touch sensing electrodes RX (including RX1, RX2, RX3 . . . RXn). The touch driving electrodes TX are on a same layer and are in parallel. The touch sensing electrodes RX are on a same layer and are in parallel. The touch driving electrodes TX and the touch sensing electrodes RX are electrically insulated from each other and cross vertically. In another embodiment of the present disclosure, the touch device 10 is self-capacitive, and the plurality of touch electrodes 11 are not divided into a plurality of touch driving electrodes and a plurality of touch sensing electrodes.

Figure 4:
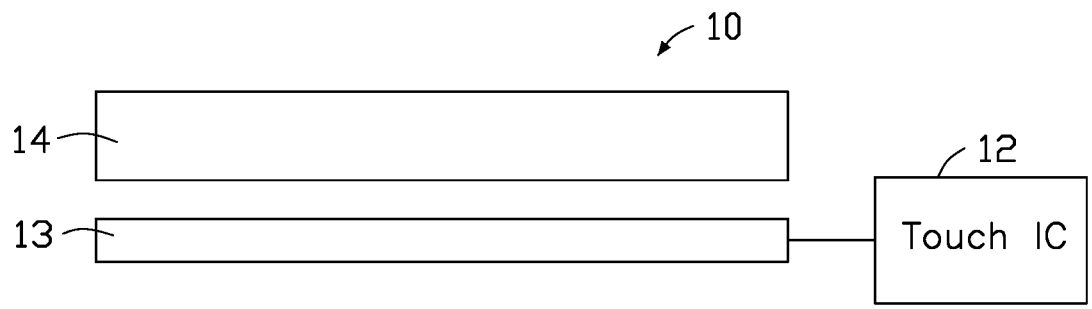
FIG. 4 is a module structure diagram of the touch device in FIG. 3.

Please refer to FIG. 4, for ease of understanding, FIG. 4 shows a touch electrode layer 13 composed of the all the touch electrodes 11 in the touch device 10 in a modular manner. As shown in FIG. 4, the touch device 10 further includes a cover 14. The touch electrode layer 13 is on a side of the cover 14, and the other side of the cover 14 is for receiving a touch operation of a finger. The touch IC 12 is also provided in the touch device 10.

Figure 5:
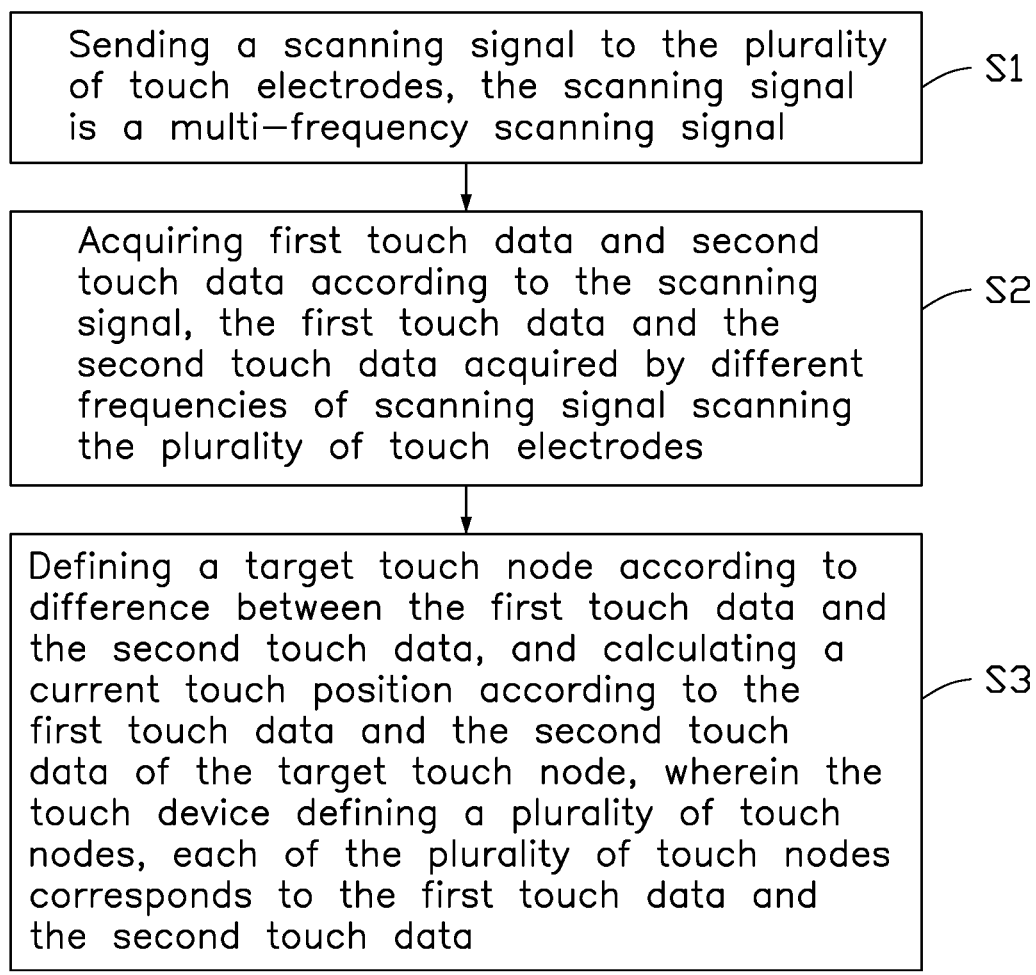
FIG. 5 is a flow chart of a touch control method in the first embodiment.

Please refer to FIG. 5, the touch control method provided in the present embodiment includes:

step S1, sending a scanning signal to the plurality of touch electrodes, wherein the scanning signal is a multi-frequency scanning signal;

step S2: acquiring first touch data and second touch data according to the scanning signal, the first touch data and the second touch data being respectively, acquired when scanning the plurality of touch electrodes with the scanning signal of different frequencies; and step S3, the touch device defining a plurality of touch nodes, each of the plurality of touch nodes corresponding to the first touch data and the second touch data, defining at least one target touch node according to a difference between the first touch data and the second touch data, and calculating a current touch position according to the first touch data and the second touch data of the at least one target touch node.

In the present embodiment, the following steps are illustrated based on a mutual-capacitive touch device 10.

Please refer to FIG. 3 to FIG. 5 jointly, in the step S1, the finger touches the cover 14, and the touch IC 12 sends the scanning signal to each touch driving electrode TX. Sending methods of the scanning signal are not limited and may include the following.

A first method is to send the scanning signal to parts of the touch electrodes 11 one by one.

In the present embodiment, the touch device 10 is a mutual-capacitive touch device as shown in FIG. 3. The touch electrodes 11 includes a plurality of touch driving electrodes TX for touch driving and a plurality of touch sensing electrodes RX for touch sensing. Therefore, the scanning signal is sent to all the touch driving electrodes TX1, TX2, TX3 . . . TXn one by one. That is, the scanning signal is sent to the electrode TX1 at time t1, the scanning signal is sent to the electrode TX2 at time t2 . . . and the scanning signal is sent to the electrode TXn at time tn.

In an embodiment of the present disclosure, the scanning signal is sent to parts of touch driving electrodes TX one by one. The part of touch driving electrodes TX are adjacent to each other, or each two adjacent touch driving electrodes TX in the part of touch driving electrodes TX are separated by a predetermined number of touch driving electrodes TX. Taking FIG. 3 as an example, the scanning signal is sent to adjacent touch driving electrodes TX1, TX2, TX3 one by one and not sent to the touch driving electrodes TX4, TX5 . . . TXn. Or, the scanning signal is sent to touch driving electrodes TX1, TX3, TX5 . . . TXn (touch driving electrodes with odd number) only.

Figure 6:
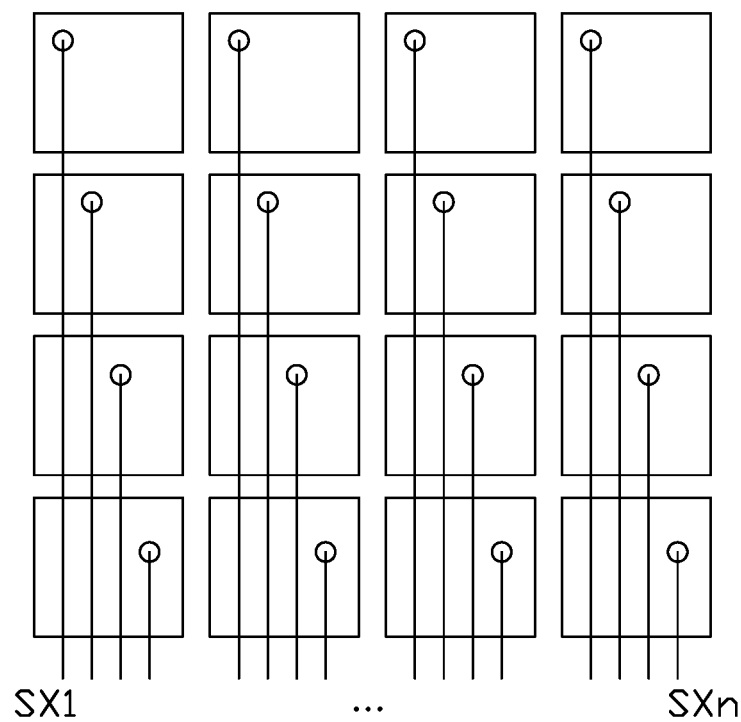
FIG. 6 is a schematic diagram of another touch device.
Figure 7:
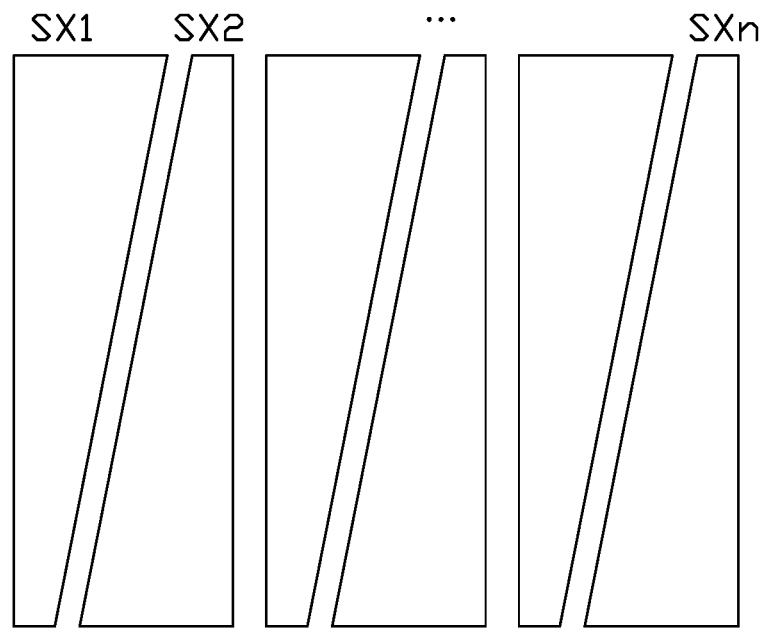
FIG. 7 is a schematic diagram of another touch device.

Please refer to FIG. 6 and FIG. 7 jointly, in another embodiment of the present disclosure, the touch device 10 is a self-capacitive touch device. Each touch electrode 11 is used for touch driving and touch sensing in a time-sharing manner. The scanning signal is sent to parts of the touch electrodes 11 one by one.

In the first method, only parts of touch electrodes 11 of the self-capacitive touch device 10 are scanned by the scanning signal. The part of touch electrodes 11 may be adjacent to each other to achieve a local scanning. Or each two adjacent touch electrodes 11 in the part of touch electrodes 11 are spaced by a predetermined number of touch electrodes 11 to achieve a rough scanning. For example, each adjacent two of the part of touch electrodes 11 are spaced by one touch electrode 11 to shorten a length of scanning time.

A second method is to send the scanning signal to parts of the touch electrodes 11 simultaneously.

The part of touch electrodes 11 in the second method are selected in a same way of those in the first method. That is, sending the scanning signal to all or parts of the touch driving electrodes TX simultaneously when it is a mutual-capacitive touch device, and sending the scanning signal to all or parts of the touch electrodes 11 simultaneously when it is a self-capacitive touch device.

Difference between the second method and the first method is that the part of touch electrodes 11 are simultaneously sent the scanning signal. Compared with sending the scanning signal to the part of touch electrodes 11 one by one, it is beneficial to shorten a length of scanning time, improve a touch response speed, and effectively reduce a parasitic capacitance between adjacent touch electrodes 11.

The third method is to send the scanning signal to all touch electrodes 11 one by one.

Please continue to refer to FIG. 6 and FIG. 7 jointly, in an embodiment of the present disclosure, the touch device 10 is a self-capacitive touch device, and the touch electrodes in FIG. 6 are block electrodes arranged in an array, and the touch electrodes in FIG. 7 are independent triangular-like electrodes. Shapes of the touch electrodes in a self-capacitance touch device are not limited to that shown in FIG. 6 and FIG. 7. Each touch electrode 11 is used for touch driving and touch sensing in a time-sharing manner and sending the scanning signal to all the touch electrodes 11 one by one.

The fourth method is to send the scanning signal to all touch electrodes 11 simultaneously.

For example, the scanning signal is sent to all touch electrodes 11 of the self-capacitive touch device 10 in the third method simultaneously. Compared with sending the scanning signal to all the touch electrodes 11 one by one, it is beneficial to shorten a length of the scanning time, improve a touch response speed, and effectively reduce a parasitic capacitance between each two adjacent touch electrodes.

In the step S1 of the present embodiment, the scanning signal includes at least a first scanning signal with a first frequency and a second scanning signal with a second frequency, wherein the first frequency and the second frequency are not equal. In the present embodiment, the first frequency is greater than the second frequency. The first frequency can also be less than the second frequency in other embodiments. The following describes the present embodiment based on the first frequency being greater than the second frequency.

In an embodiment, the first frequency is 100 KHZ-1 MHz, and the second frequency is 20 KHZ-150 KHZ.

In another embodiment, the first frequency is M times the second frequency, wherein M≥2.

During a scanning frame, a group of scanning signals are sent to all or parts of the touch electrodes 11 continuously, the group of scanning signals includes scanning signals of N frequencies, wherein 1≤N≤3.

In the present embodiment, N=2, the scanning signal in each group includes the first scanning signal and the second scanning signal.

In the present embodiment, the touch device 10 is as described in the first method, and the touch IC 12 sends the scanning signal to touch driving electrodes TX1, TX2, TX3 . . . TXn one by one. Further, the touch IC 12 alternately sends the first scanning signal and the second scanning signal to the touch driving electrodes TX1, TX2, TX3 . . . TXn, respectively.

That is, for example, sending the first scanning signal to the touch driving electrode TX1, and then sending the second scanning signal to the touch driving electrode TX1. Process above is defined as one scanning group.

Then, the first scanning signal is sent to the touch driving electrode TX2, and then the second scanning signal is sent to the touch driving electrode TX2. Process above is defined as another one scanning group.

According to the processes above, the touch driving electrodes TX1, TX2, TX3 . . . TXn are scanned one by one. Defining a cycle for completing scanning the touch driving electrodes TX1, TX2 TX3 . . . TXn as the scanning frame, wherein the scanning frame includes a plurality of scanning groups.

First frequencies in different scanning groups are the same or different, and/or, second frequencies in different scanning groups are the same or different.

That is:

In an embodiment, the first frequency of the first scanning signal scanning the touch driving electrode TX1 is the same as the first frequency of the first scanning signal scanning the touch driving electrode TX2, and the second frequency of the second scanning signal scanning the touch driving electrode TX1 is the same as the second frequency of the second scanning signal scanning the touch driving electrode TX2.

In another embodiment, the first frequency of the first scanning signal scanning the touch driving electrode TX1 is not the same as the first frequency of the first scanning signal scanning the touch driving electrode TX2, and the second frequency of the second scanning signal scanning the touch driving electrode TX1 is not the same as the second frequency of the second scanning signal scanning the touch driving electrode TX2.

In another embodiment, the first frequency of the first scanning signal scanning the touch driving electrode TX1 is not the same as the first frequency of the first scanning signal scanning the touch driving electrode TX2, and the second frequency of the second scanning signal scanning the touch driving electrode TX1 is the same as the second frequency of the second scanning signal scanning the touch driving electrode TX2. Or the first frequency of the first scanning signal scanning the touch driving electrode TX1 is the same as the first frequency of the first scanning signal scanning the touch driving electrode TX2, and the second frequency of the second scanning signal scanning the touch driving electrode TX1 is not the same as the second frequency of the second scanning signal scanning the touch driving electrode TX2.

Further, touch data includes the first touch data and the second touch data. The step S2 includes: acquiring the first touch data according to the first scanning signal and acquiring the second touch data according to the second scanning signal. The first touch data and the second touch data are acquired alternately, wherein the first scanning signal and the second scanning signal are alternately sent to scan the touch electrodes.

The touch device defining a plurality of touch nodes. The first touch data includes first detection capacitances corresponding to each touch node when the touch electrodes are scanned by the first scanning signal. The second touch data comprises second detection capacitances corresponding to each touch node when the touch electrodes are scanned by the second scanning signal.

Figure 8:
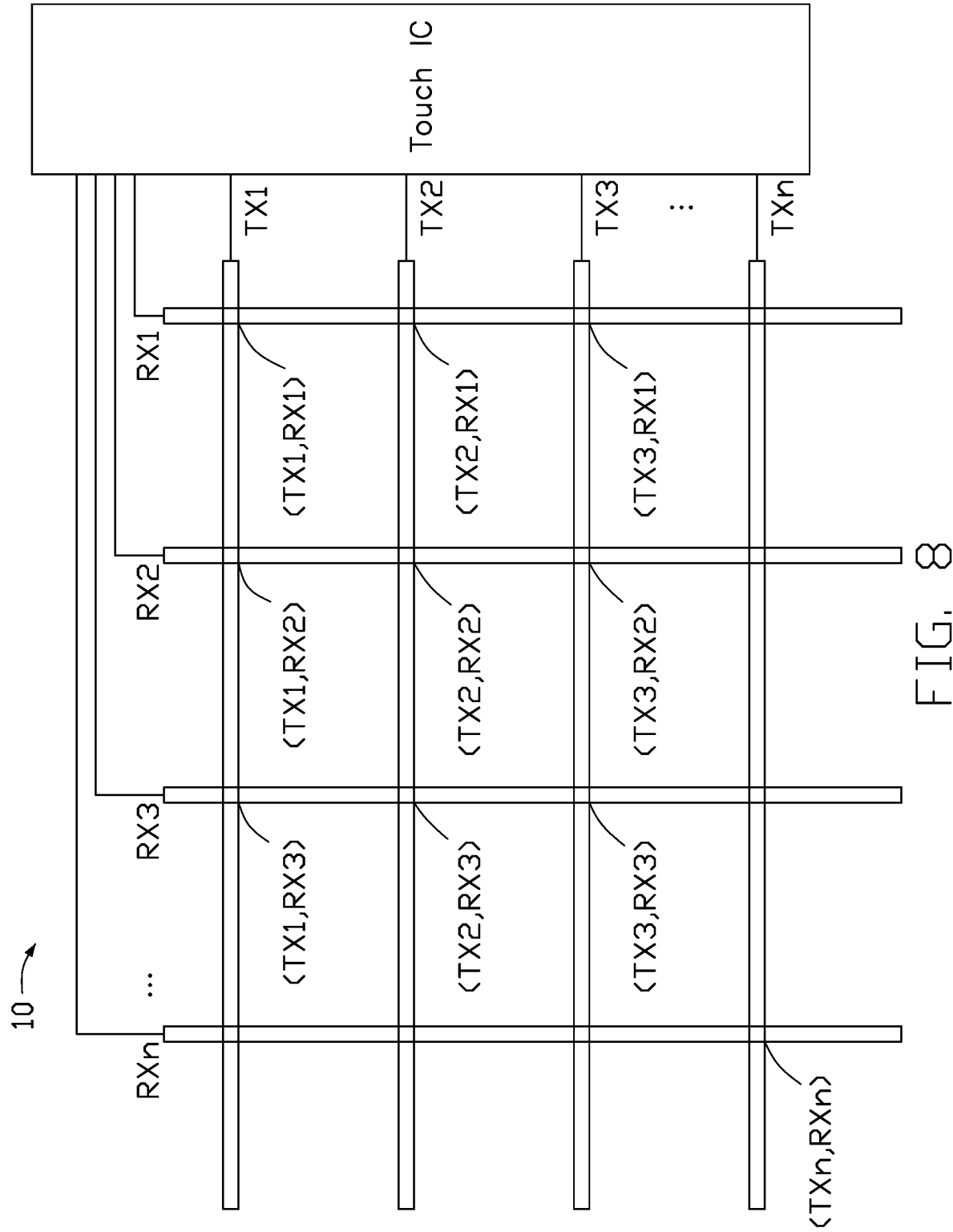
FIG. 8 is another schematic diagram of the touch device in the first embodiment.

Please refer to FIG. 8, the touch driving electrodes TX and the touch sensing electrodes RX are electrically insulated and cross vertically. Crossing nodes of the touch driving electrodes TX and the touch sensing electrodes RX are defined as the touch nodes, which include touch node (TX1, RX1), (TX1, RX2), (TX1, RX3), (TX2, RX1), (TX2, RX2), (TX2, RX3), (TX3, RX1), (TX3, RX2), (TX3, RX3) . . . (Txn, RXn). Each touch node forms an initial coupling capacitance Cm.

The touch IC 12 sends the first scanning signal to the touch driving electrodes TX. When a finger (not shown) is placed on a cover (not shown) of the touch device 10, the initial coupling capacitance of touch nodes closing to the finger changes, wherein the touch sensing electrodes RX can output the first touch data to the touch 1C 12. The first touch data is capacitances detected on each touch nodes when the touch driving electrodes TX are scanned by the first scanning signal, which is defined as the first detection capacitance. In the present embodiment, the first detection capacitance of each touch node is denoted as CM1. Similarly, the touch IC 12 sends the second scanning signal to the touch driving electrodes TX. When the finger (not shown) is placed on the cover (not shown) of the touch device 10, the initial coupling capacitance of touch nodes closing to the finger changes, wherein the touch sensing electrodes RX can output the second touch data to the touch IC 12. The second touch data is capacitances detected on each touch nodes when the touch driving electrodes TX are scanned by the second scanning signal, which is defined as the second detection capacitance. In the present embodiment, the second detection capacitance of each touch node is denoted as CM2.

Conductivities of the first scanning signal and the second scanning signal are different since the first scanning signal having the first frequency and the second scanning signal having the second frequency, which makes the first scanning signal and the second scanning signal having different degree of influences on the initial coupling capacitance. The first touch data and the second touch data in the step S2 are different because the touch driving electrodes TX are scanned by scanning signals with different frequency.

Figure 9:
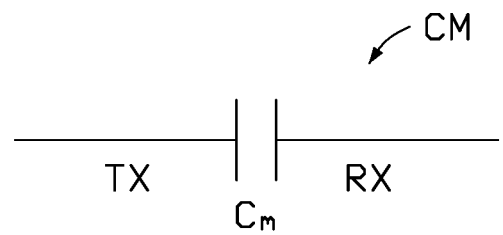
FIG. 9 is a schematic diagram of a state of the coupling capacitance when no finger is touching or no water droplet.

Please refer to FIG. 9, in a condition of no finger or no water droplet on the cover, the detection capacitance CM is equivalent to the coupling capacitance Cm between touch driving electrodes TX and touch sensing electrodes RX.

Figure 10:
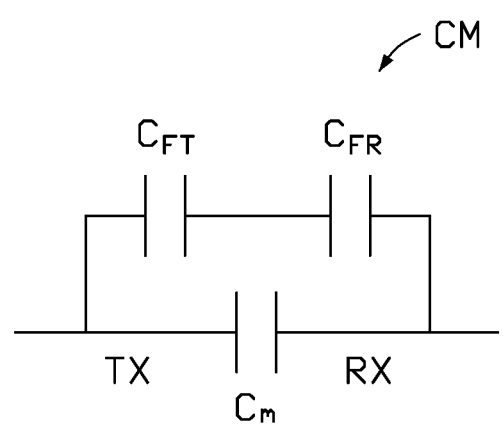
FIG. 10 is a schematic diagram of a state of the coupling capacitance when a finger is touching.

Please refer to FIG. 10, in a condition that only finger touch the cover, the detection capacitance CM is an equivalent capacitance of the coupling capacitance $C_{FT}$ and $C_{FT}$ generated by the finger and the coupling capacitance Cm between the touch driving electrodes TX and the touch sensing electrodes RX.

Figure 11:
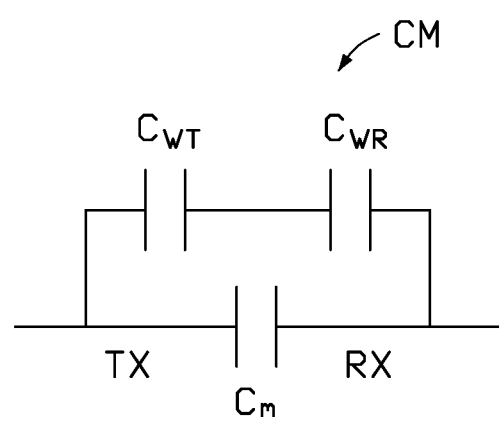
FIG. 11 is a schematic diagram of a state of the coupling capacitance when water droplets are covering.

Please refer to FIG. 11, in a condition that only water droplets (including clean water, sea water, salt water, etc.) on the cover, the detection capacitance CM is an equivalent capacitance of the coupling capacitance $C_{WT}$ and $C_{WR}$ generated by the water droplets and the coupling capacitances Cm between the touch driving electrodes TX and the touch sensing electrodes RX.

The following describes differences between the first touch data and the second touch data obtained in conditions of finger touch and water droplets coverage when scanning signals with different frequencies scanning the touch electrodes with specific testing data.

Since the touch device 10 has a large number of touch nodes, testing data of parts of the touch nodes are selected for describing in the present embodiment.

Please refer to Table 1, Table 1 shows parts of the first touch data and the second touch data (detection capacitance) when a finger touch is received, wherein the touch driving electrodes TX are scanned by the first scanning signal with a frequency of 180 KHZ and the second scanning signal with a frequency of 50 KHZ.

TABLE 1

| Touch node | First detection capacitance CM1 (pf, The first frequency is 180 KHZ) | Second detection capacitance (pf, The second frequency is 50 KHZ) | ΔCM = CM2 − CM1 |
|---|---|---|---|
| (TX1, RX1) | 0.52 | 0.71 | 0.19 |
| (TXI, RX2) | 0.55 | 0.75 | 0.20 |
| (TX1, RX3) | 0.59 | 0.79 | 0.20 |
| (TX2, RX1) | 0.51 | 0.65 | 0.14 |
| (TX2, RX2) | 0.52 | 0,66 | 0.14 |
| (TX2, RX3) | 0.59 | 0.77 | 0.18 |
| (TX3, RX1) | 0.53 | 0.66 | 0.13 |
| (TX3, RX2) | 0.53 | 0.65 | 0.12 |
| (TX3, RX3) | 0.59 | 0.73 | 0.14 |

Please refer to Table 2, Table 2 shows parts of the first touch data and the second touch data (detection capacitance) when water droplets covering the cover of the touch device 10, wherein the touch driving electrodes TX are scanned by the first scanning signal with a frequency of 180 KHZ and the second scanning signal with a frequency of 50 KHZ.

TABLE 2

| Touch node | First detection capacitance CM1 (pf, The first frequency is 180 KHZ) | Second detection capacitance (pf, The second frequency is 50 KHZ) | ΔCM = CM2 − CM1 |
|---|---|---|---|
| (TX1, RX1) | 0.54 | 0.82 | 0.28 |
| (TX1, RX2) | 0.55 | 0.83 | 0.28 |
| (TX1, RX3) | 0.55 | 0.82 | 0.27 |
| (TX2, RX1) | 0.59 | 0.87 | 0.28 |
| (TX2, RX2) | 0.60 | 0.88 | 0.28 |
| (TX2, RX3) | 0.61 | 0.87 | 0.26 |
| (TX3, RX1) | 0.62 | 0.88 | 0.26 |
| (TX3, RX2) | 0.64 | 0.89 | 0.25 |
| (TX3, RX3) | 0.64 | 0.88 | 0.24 |

It can be seen from the testing data above that in a condition of only a finger touch, the maximum difference between the first detection capacitance (the first touch data) and the second detection capacitance (the second touch data) of the touch nodes is 0.2 pf, wherein the touch electrodes are scanned with scanning signals of different frequencies. An average of the difference calculated is 0.16 pf. When only the water droplets are covered, the maximum difference between the first detection capacitance and the second detection capacitance of the touch nodes is 0.28 pf, wherein the touch electrodes are scanned with scanning signals of different frequencies. An average of the difference calculated is 027 pf.

The difference between the first touch data and the second touch data is because scanning signals of different frequencies have different conductivities in the finger and the water droplets. However, according to the testing data, when scanning with scanning signals of different frequencies, the coupling capacitance difference ACM under the condition of finger touch is obviously less than under the condition of water droplet coverage. It can be seen that the conductivity difference of the scanning signals of different frequencies in the finger is less than that in the water droplets. The higher the frequency of the scanning signal, the worse the conductivity of the scanning signal in the water droplets and the greater the transmission loss of the scanning signal. The conductivity of the scanning signal in the water droplets will be completely lost (that is, the conductivity is zero) if the frequency of the scanning signal is hundreds of MHZ or more. There is a difference of 0.08 PF between the maximum difference of the finger touch and the water droplets coverage, that is, 0.28 pf-0.2 pf=0.08 pf. The difference is close to 0.1 pf. In actual products, capacitance caused by finger touch is usually 0.05 pf. A capacitance having a capacitance ratio more than 10% with the capacitance caused by finger touch can be used as effective data for analysis. According to the testing data, a ratio of the difference 0.1 and the capacitance 0.05 is 2, which is much greater than 10%. Therefore, it can be accurately judged whether there are water droplets.

Please refer to FIG. 12, the step S3 includes:

step S31, calculating a detection capacitance difference of each of the plurality of touch nodes, wherein the first touch data comprises a first detection capacitance and the second touch data comprises a second detection capacitance, the detection capacitance difference is a difference between the first detection capacitance and the second detection capacitance;

step S32, setting a difference threshold, defining touch node corresponding to the detection capacitance difference being less than the difference threshold as the at least one target touch node, and defining the touch node corresponding to the detection capacitance difference being greater than the difference threshold as an interference touch node;

step S33, calculating the current touch position according to the first detection capacitance and the second detection capacitance corresponding to the at least one target touch node.

In the step S31, the touch IC 12 calculates a difference between the first touch data and the second touch data to calculate a detection capacitance difference (that is, the coupling capacitance difference ACM in the Table 1 and the Table 2) of each touch node. The detection capacitance difference is caused by frequency differences between the first scanning signal and the second scanning signal scanning the touch driving electrodes TX.

Based on the above, effects of the finger and the water droplets on the initial coupling capacitance of the touch nodes are similar. A conductivity difference of scanning signals with different frequencies in the finger is less than that in the water droplets. That is, when the touch electrodes TX are scanned by scanning signals of different frequencies, the difference between the first touch data and the second touch data (the detection capacitance difference) when the cover is covered with the finger is less than that when the cover is covered with the water droplets. Taking advantage of this feature, by analyzing the difference (detection capacitance difference) between the first touch data and the second touch data on each touch node, it can be judged whether it is a finger or water droplets that caused the initial coupling capacitance change on the touch nodes.

In the step S32, a difference threshold is set and the detection capacitance difference corresponding to each touch node is compared with the difference threshold. The difference threshold may be determined according to frequencies of the first scanning signal and the second scanning signal, the testing data, and so on. The touch node is defined to be a target touch node if the detection capacitance difference corresponding to the touch node is less than the difference threshold, wherein the initial coupling capacitance change is considered to be caused by the finger. The touch node is defined to be an interference touch node if the detection capacitance difference corresponding to the touch node is greater than the difference threshold, wherein the initial coupling capacitance change is considered to be caused by the water droplets.

After confirming the target touch node, in the step S33, the current touch position is calculated according to the first detection capacitance and the second detection capacitance of the target touch node.

The touch control method provided by the present embodiment scans the touch electrodes 11 with a first scanning signal of a first frequency and a second scanning signal of a second frequency to obtain the first touch data and the second touch data, respectively. Using characteristics that the conductivity difference of scanning signals of different frequencies in the finger is smaller than that in the water droplets, whether the initial coupling capacitance change on each touch node is caused by the finger or the water droplets is determined according to the difference between the first touch data and the second data, thus the initial coupling capacitance change caused by the water droplets can be eliminated. The current touch position can be calculated only according to the initial coupling capacitance change caused by the finger. The above method helps to improve a problem that water droplets affect a touch function. The touch control method provided in the present embodiment is applied to a touch device, wherein the touch function can work normally even the touch device 10 is used in wet or water-existing scenes.

The touch device 10 provided in the present embodiment is no limited to monolithic, fully bonded, in-cell, and plug-in capacitive touch screen.

Embodiment 2

A difference between the touch control method provided in the present embodiment and the first embodiment is that the touch electrode 11 are scanned differently. Only the difference will be described in detail below, and other steps will not be repeated.

In the present embodiment, the step S1 includes continuously sending N frames of scanning signals of different frequencies to all or parts of the touch electrodes 11, wherein $2 \leq N \leq 3$.

The touch device 10 is as described in the first method. In the present embodiment, N=2, and the touch IC 12 continuously sends two frames of scanning signals to all the touch electrodes 11. The two frames of scanning signals are the first scanning signal of the first frequency and the second scanning signal of the second frequency. Specifically, the touch IC 12 sends the first scanning signal and the second scanning signal to the touch driving electrodes TX1, TX2, TX3 . . . TXn alternately.

That is, for example, sending the first scanning signal to the touch driving electrodes TX1, TX2, TX3 . . . TXn one by one once, which is defined as a scanning frame; and then sending the second scanning signal to the touch driving electrodes TX1, TX2, TX3 . . . TXn one by one once, which is defined as another scanning frame. Then sending the first scanning signal to the touch driving electrodes TX1, TX2, TX3 . . . TXn one by one once again, and sending the second scanning signal to the touch driving electrodes TX1, TX2, TX3 . . . TXn one by one once again. In other embodiments, the second scanning signal may be sent first and then the first scanning signal, which is not limited in the present disclosure.

In another embodiment, N=3, and the touch IC 12 continuously send three frames of scanning signals to all the touch electrodes 11. The three frames of scanning signals are the first scanning signal of the first frequency, the second scanning signal of the second frequency, and a third scanning signal of a third frequency. Specifically, the touch IC 12 sends the first scanning signal, the second scanning signal, and the third canning signal to the touch driving electrodes TX1, TX2, TX3 . . . TXn alternately.

That is, for example, sending the first scanning signal to the touch driving electrodes TX1, TX2, TX3 . . . TXn one by one once, which is defined as the scanning frame; and then sending the second scanning signal to the touch driving electrodes TX1, TX2, TX3 . . . TXn one by one once, which is defined as another scanning frame; and then sending the third scanning signal to the touch driving electrodes TX1, TX2, TX3 . . . TXn one by one once, which is defined as another scanning frame. Scanning sequences of the first scanning signal, the second scanning signal, and the third scanning signal are not limited in the present disclosure.

The touch control method provided in the present embodiment can achieve all the beneficial effects as described in the first embodiment.

Embodiment 3

A difference between the touch control method provided in the present embodiment and the first embodiment is that sending the first scanning signal and the second scanning signal to the touch electrodes 11 simultaneously in the step S1. Only the difference will be described in detail below.

Figure 14:
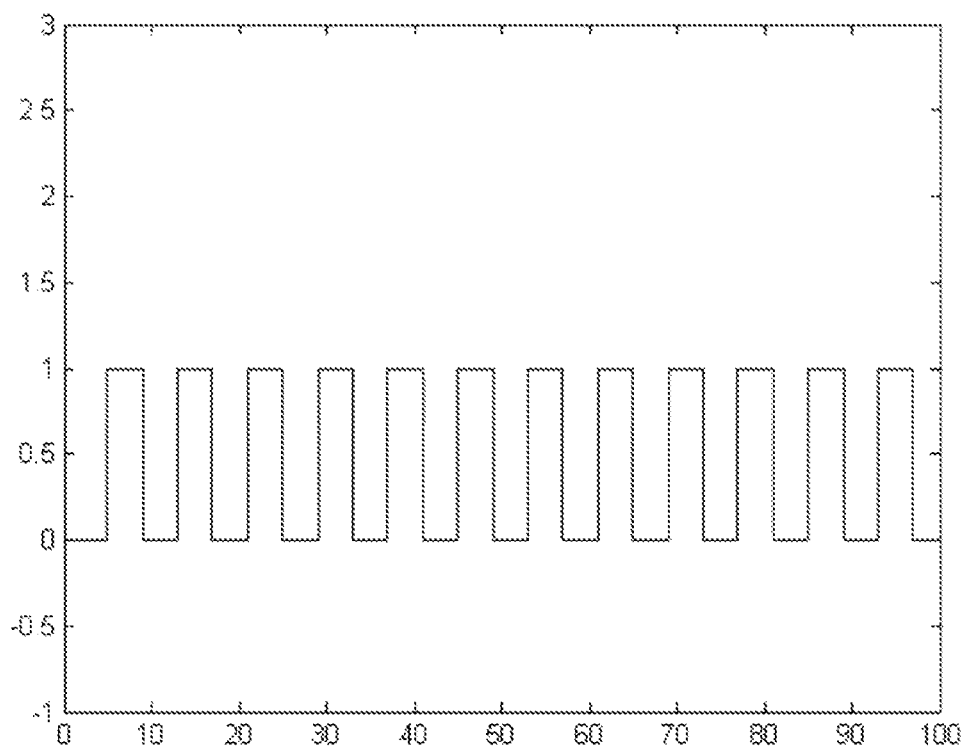
FIG. 14 is a waveform diagram of a second scanning signal.

In the present embodiment, the first scanning signal and the second scanning signal are simultaneously sent to the touch driving electrodes TX, wherein a waveform of the first scanning signal is shown in FIG. 13, and a waveform of the second scanning signal is shown in FIG. 14. When the first scanning signal and the second scanning signal are simultaneously sent to the touch driving electrodes TX, the first scanning signal and the second scanning signal are superimposed to form a signal having a waveform shown in FIG. 15 to scan the touch driving electrodes TX.

Figure 16:
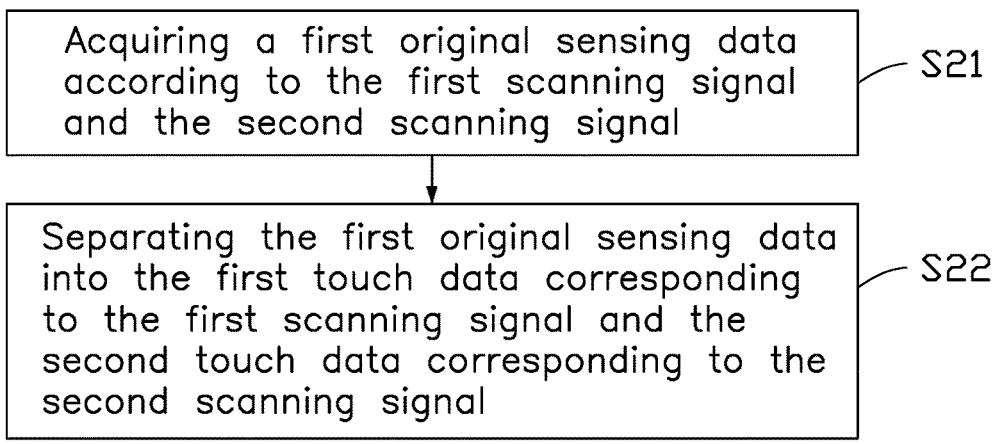
FIG. 16 is a flow chart of detailed steps of step S2 in a touch control method in a third embodiment.

Please refer to FIG. 16, the step S2 includes:

step S21, acquiring first original sensing data according to the first scanning signal and the second scanning signal; and step S22, separating the first original sensing data into the first touch data corresponding to the first scanning signal and the second touch data corresponding to the second scanning signal.

Figure 15:
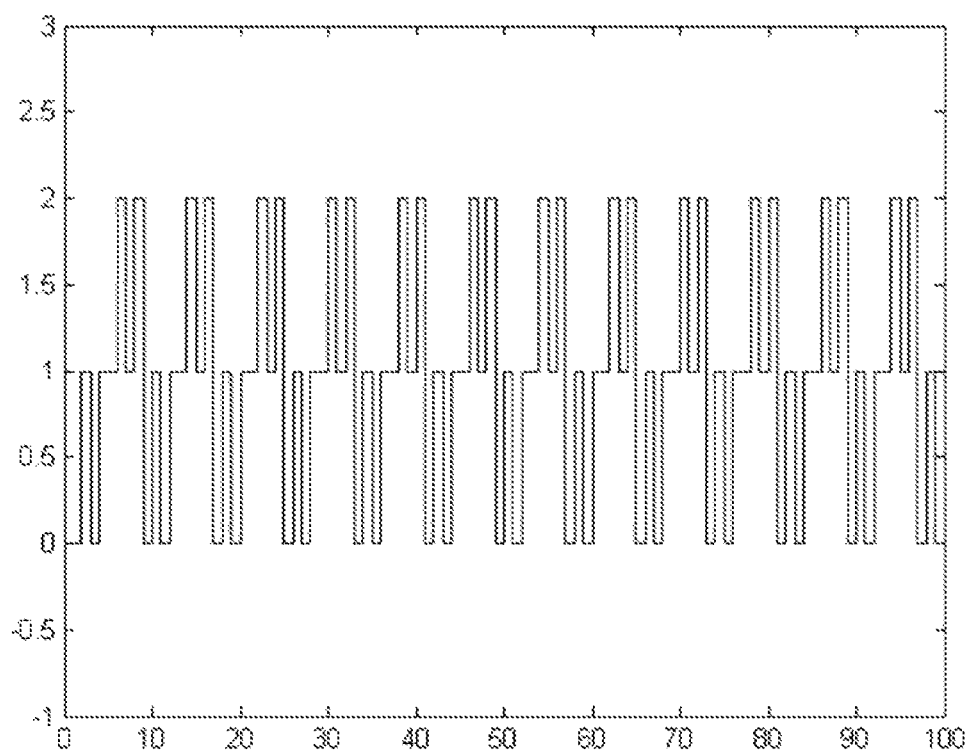
FIG. 15 is a waveform diagram of superimposing the first scanning signal in FIG. 13 and the second scanning signal in FIG. 14.

In the step S21, the first original sensing data is transmitted to the touch IC 12 after the signal shown in FIG. 15 scans the touch driving electrodes TX. In the step S22, the touch IC 12 separates the first original sensing data. For example, using a filter to separate the first original sensing data into the first touch data and the second touch data, wherein the first touch data corresponds to the first canning signal, and the second touch data corresponds to the second scanning signal. That is, the first touch data can be regarded as obtained when the touch driving electrodes TX are scanned by the first scanning signal alone, and the second touch data can be regarded as obtained when the touch driving electrodes TX are scanned by the second scanning signal alone.

The step S3 is as described in the first embodiment and will not be repeated here.

It should be understood that the touch control method provided in the present embodiment can achieve all the beneficial effects as described in the first embodiment, and on this basis, scanning time is reduced since the first scanning signal and the second scanning signal are sent simultaneously, which improves a response speed of a touch process.

Embodiment 4

A difference between the touch control method provided in the present embodiment and the first embodiment is that the scanning signal is a single frequency and non-sine wave (such as a single frequency square wave) in the step S1. Only the difference will be described in detail below.

Figure 17:
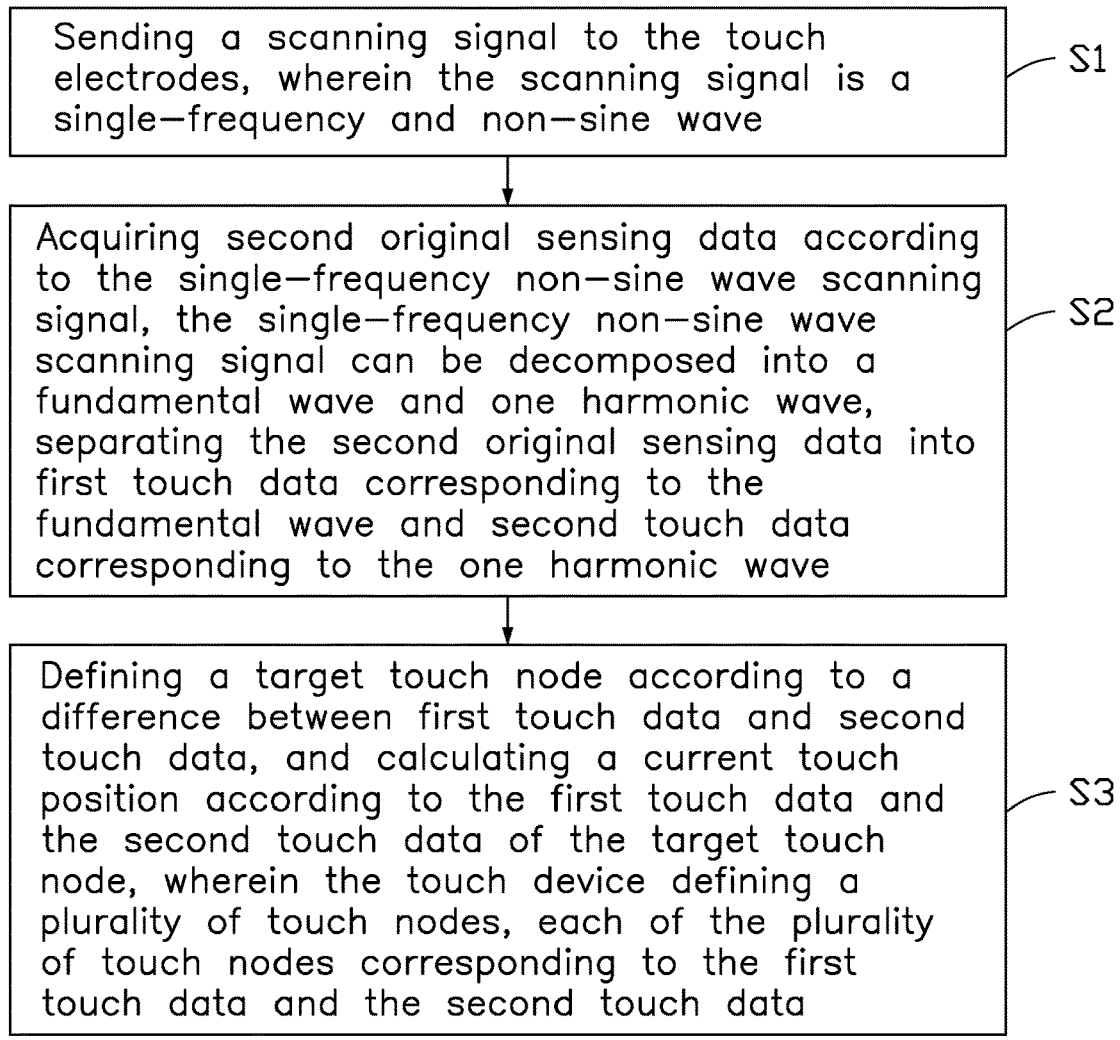
FIG. 17 is a low chart of a touch control signal in a fourth embodiment.

In the present embodiment, the single-frequency non-sine wave can be decomposed into a fundamental wave and one harmonic wave after Fourier transform. Please refer to FIG. 17, the touch control method includes:

step S1, sending a scanning signal to the plurality of touch electrodes, wherein the scanning signal is a single-frequency non-sine wave scanning signal;

step S2, acquiring second original sensing data according to the single-frequency non-sine wave scanning signal, the single-frequency non-sine wave scanning signal can be decomposed into a fundamental wave and one harmonic wave, separating the second original sensing data into first touch data corresponding to the fundamental wave and second touch data corresponding to the one harmonic wave; and step S3, the touch device defining a plurality of touch nodes, each of the plurality of touch nodes corresponding to the first touch data and the second touch data, defining at least one target touch node according to a difference between the first touch data and the second touch data, and calculating a current touch position according to the first touch data and the second touch data of the at least one target touch node.

Figure 18:
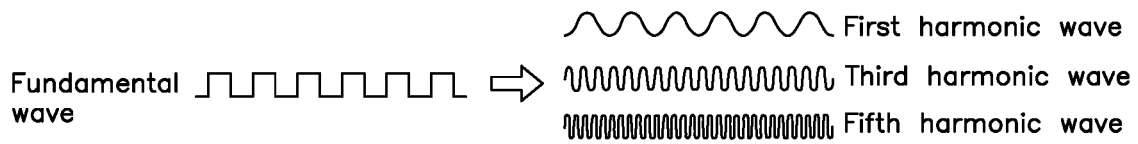
FIG. 18 is a waveform diagram of a scanning signal in the fourth embodiment.

Please refer to FIG. 18, in the present embodiment, the scanning signal is a single-frequency non-sine wave. The touch IC 12 can obtain the second original sensing data by scanning the touch driving electrodes TX with the scanning signal. The touch IC 12 can separate the second original sensing data into the first touch data and the second touch data since the scanning signal can be decomposed into the fundamental wave and the one harmonic wave by Fourier transform. The first touch data corresponds to the fundamental wave, and the second touch data corresponds to the one harmonic wave. That is, the first touch data can be regarded as acquired when the touch driving electrodes TX are scanned with the fundamental wave alone, and the second touch data can be regarded as acquired when the touch driving electrodes TX are scanned with the one harmonic wave alone.

The step S3 in the present embodiment is the same as the step S3 in the first embodiment and will not be repeated here.

It should be understood that the touch control method provided in the present embodiment can achieve all the beneficial effects as described in the first embodiment, and on this basis, it's can further shorten scanning time of the touch driving electrodes TX since only single-frequency non-sine wave is used (it can also be considered as the fundamental wave and the one harmonic wave simultaneous scanning), which also increases the response speed of the touch process.

Embodiment 5

Figure 19:
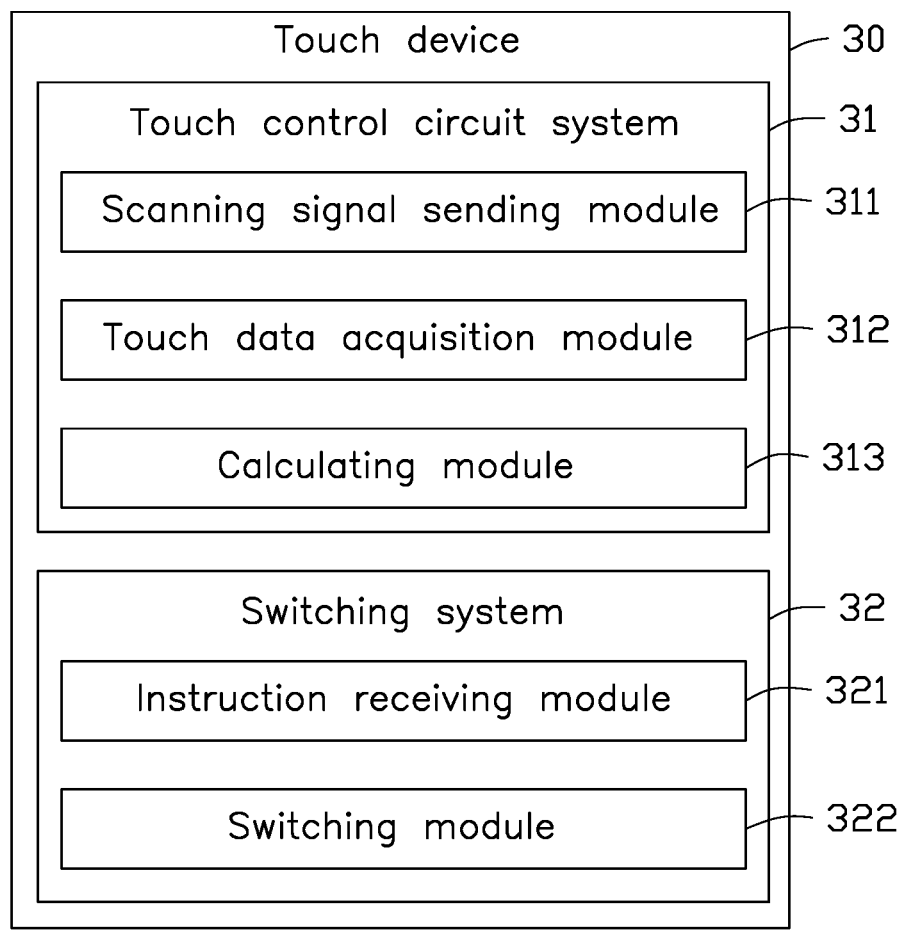
FIG. 19 is a module schematic diagram of a touch device in a fifth embodiment.

Please refer to FIG. 19, the touch device 30 provided in the present embodiment includes a touch control circuit system 31 and a plurality of touch electrodes (not shown). The touch control circuit system 31 includes:

a scanning signal sending module 311 connected to the plurality of touch electrodes and configured to send a scanning signal to all or parts of the plurality of touch electrodes, wherein the scanning signal is a multi-frequency scanning signal or a single-frequency non-sine wave scanning signal;

a touch data acquisition module 312 electrically connected to the plurality of touch electrodes and configured to acquire first touch data and second data touch data according to the scanning signal, the first touch data and the second touch data are acquired when scanning the plurality of touch electrodes with the scanning signal of different frequencies; and a calculation module 313 electrically connected to the touch data acquisition module, the touch device defining a plurality of touch nodes, each of the plurality of touch nodes corresponding to the first touch data and the second touch data, the calculation module being configured to define at least one target touch node according to a difference between the first touch and the second touch data corresponding to the at least one target touch node, and calculate a current touch position according to the first touch data and the second touch data corresponding to the at least one target touch node.

It should be understood that the touch control circuit system 31 and the touch device 30 provided in the present embodiment can execute any steps as described in the embodiment 1 through embodiment 4 and can achieve all the beneficial effects as described in the embodiment 1 through embodiment 4.

Further, the touch device 30 prestored a first touch mode and a second touch mode. The first touch mode may be a "waterproof mode" and includes the steps of the touch control method as described in any one of embodiment 1 through embodiment 4 and can be used as a touch control method. The second touch mode is different from the first touch mode. For example, sending a canning signal only in a single frequency to scan the touch electrodes, and acquiring touch sensing data according to the scanning signal with a single frequency. The touch sensing data is regarded as caused by the finger only. The touch sensing data is directly used to calculate the touch position and is not used to determine whether there is touch sensing data caused by the interference of water droplets.

The touch device 30 includes a switching system 32 including:

an instruction receiving module 321 configured to receive a touch mode setting instruction;

a switching module 322 configured to control the touch device to switch to the first touch mode or the second touch mode according to the touch mode setting instruction.

Furthermore, the instruction receiving module 321 includes:

a detection unit configured to detect a environmental parameter of a current environment the touch device located;

a generating unit configured to generate the touch mode setting instruction according to the environmental parameter.

In the present embodiment, the touch mode setting instruction is automatically generated by the touch device 30, and the environmental parameter is humidity. A humidity threshold can be set. Generating the touch mode setting instruction of switching to the "waterproof mode" when the humidity of the current environment is greater than the humidity threshold. That is, the touch device 30 is controlled to switch to the first touch mode according to the touch mode setting instruction.

In an embodiment, the touch mode setting instruction is generated according to human operation. The instruction receiving module 321 is configured to receive a mode setting operation by a user to generate the setting instruction. The mode setting operation is not limited to touch, pushing a button or voice control.

The first touch mode has high practicability when waterproofing is required. The touch device provided in the present embodiment can switched to a corresponding touch mode according to different environment, which can avoid using the first touch mode when waterproofing is not required, which can further avoid bringing unnecessary burden to the touch device 30 since the first touch mode is more complicated than the second touch mode.

In the present embodiment, the touch control circuit system 31 and the switching system 32 form a touch control chip.

In an embodiment, the touch control circuit system 31 and the switching system 32 as a functional module of a touch control chip.

In an embodiment, the touch device 30 includes a main board (not shown) and a touch control chip (not shown). The touch control circuit system 31 and the switching system 32 are both on the main board.

In another embodiment, parts of the touch control circuit system 31 and the switching system 32 are on the main board, and the other part is as a functional module of a touch control chip.

The touch control circuit system 31 and the switching system 32 are not limited to the above-listed.

The touch device in the embodiments of the present disclosure may be mobile phone, wearable device, smart home, and other products. There may be water droplets on the mobile phone and the wearable device when users in a watery or humid environment, such as rain, sweating, and swimming. There may be water droplets on the smart home when the smart home is used in a kitchen or a toilet. The touch function of the touch device in each embodiment of the present disclosure can be normally used in all situations above.

Touch screen devices are not limited to displayable devices such as LCD, LED or OLED, but also include touch devices without display function.

Ordinary technicians in the technical field should realize that the above embodiments are only used to illustrate the present disclosure and not to limit the present disclosure. Appropriate changes made to the above embodiments fall within a protection scope of the present disclosure as long as the changes are within a substantive spirit of the present disclosure.

The invention claimed is:

1. A touch control method applied to a touch device, the touch device comprising a plurality of touch electrodes, the touch control method comprising:
    step S1, sending a scanning signal to the plurality of touch electrodes, the scanning signal being a multi-frequency scanning signal;
    step S2, acquiring first touch data and second touch data according to the scanning signal, the first touch data and the second touch data being respectively acquired when scanning the plurality of touch electrodes with the scanning signal of different frequencies; and
    step S3, defining a plurality of touch nodes by the touch device, each of the plurality of touch nodes corresponding to one of the first touch data and one of the second touch data, defining any touch node having a difference between the corresponding first touch data and the corresponding second touch data less than a preset difference threshold as a target touch node, and calculating a current touch position according to the first touch data and the second touch data of the target touch node.

2. The touch control method of claim 1, wherein the step S1 comprises:
    sending the scanning signal to all the plurality of touch electrodes one by one; or
    sending the scanning signal to all the plurality of touch electrodes simultaneously.

3. The touch control method of claim 1, wherein the step S1 comprises:
    sending the scanning signal to parts of the plurality of touch electrodes one by one; or
    sending the scanning signal to parts of the plurality of touch electrodes simultaneously.

4. The touch control method of claim 3, wherein the parts of the plurality of touch electrodes are adjacent to each other; or
    each two adjacent touch electrodes of the parts of the plurality of touch electrodes are separated by a predetermined number of touch electrodes not being sent the scanning signal.

5. The touch control method of claim 1, wherein the scanning signal comprises at least a first scanning signal with a first frequency and a second scanning signal with a second frequency, the first frequency and the second frequency are not equal, the first scanning signal corresponds to the first touch data, and the second scanning signal corresponds to the second touch data.

6. The touch control method of claim 5, wherein the first frequency is M times the second frequency, and M≥2.

7. The touch control method of claim 6, wherein the first frequency is 100 KHZ-1 MHZ, and the second frequency is 20 KHZ-150 KHZ.

8. The touch control method of claim 5, wherein the step S1 comprises:
sending the first scanning signal and the second scanning signal alternately to all or a part of the plurality of touch electrodes.

9. The touch control method of claim 8, wherein the step S1 comprises:
sending a group of scanning signals to all or a part of the plurality of touch electrodes continuously during a scanning frame;
the sending a group of scanning signals comprises:
alternately sending scanning signals of N frequencies, wherein 2≤N≤3.

10. The touch control method of claim 9, wherein each group of scanning signals comprises at least a first scanning signal and a second scanning signal alternately sent;
frequencies of the first scanning signals in different groups of scanning signals are the same or different; or
frequencies of the second scanning signals in different groups of scanning signals are the same or different.

11. The touch control method of claim 8, wherein the step S1 further comprises:
sending N frames of scanning signal to all or a part of the plurality of touch electrodes, wherein frequencies of each frame of scanning signals are different and 2≤N≤3.

12. The touch control method of claim 8, wherein the step S2 further comprises:
acquiring the first touch data according to the first scanning signal and acquiring the second touch data according to the second scanning signal, the first touch data and the second touch data being acquired alternately.

13. The touch control method of claim 5, wherein the step S1 comprises:
sending the first scanning signal and the second scanning signal simultaneously to all or parts of the plurality of touch electrodes.

14. The touch control method of claim 13, wherein the step S2 comprises:
step S21, acquiring first original sensing data according to the first scanning signal and the second scanning signal; and
step S22, separating the first original sensing data into the first touch data corresponding to the first scanning signal and the second touch data corresponding to the second scanning signal.

15. The touch control method according to claim 12, wherein the step S3 comprises:
step S31, calculating a detection capacitance difference of each of the plurality of touch nodes, wherein the first touch data comprises a first detection capacitance and the second touch data comprises a second detection capacitance, the detection capacitance difference is a difference between the first detection capacitance and the second detection capacitance;

step S32, defining any touch nodes having a detection capacitance difference less than the difference threshold as the target touch node, and defining the touch node having a detection capacitance difference greater than the difference threshold as an interference touch node; and
step S33: calculating the current touch position according to the first detection capacitance and the second detection capacitance corresponding to the at least one target touch node.

16. A touch control method applied to a touch device, the touch device comprising a plurality of touch electrodes, the touch control method comprising:
step S1, sending a scanning signal to the plurality of touch electrodes, wherein the scanning signal is a single-frequency non-sine wave scanning signal;
step S2, acquiring second original sensing data according to the single-frequency non-sine wave scanning signal, the single-frequency non-sine wave scanning signal can be decomposed into a fundamental wave and one harmonic wave, separating the second original sensing data into first touch data corresponding to the fundamental wave and second touch data corresponding to the one harmonic wave; and
step S3, defining a plurality of touch nodes by the touch device, each of the plurality of touch nodes corresponding to the first touch data and the second touch data, defining any touch node having a difference between the corresponding first touch data and the corresponding second touch data less than a preset difference threshold as a target touch node, and calculating a current touch position according to the first touch data and the second touch data of the target touch node.

17. A touch control circuit system applied to a touch device, the touch device comprising a plurality of touch electrodes, the touch control circuit system comprising:
a scanning signal sending circuit, electrically connected to the plurality of touch electrodes and configured to send a scanning signal to all or a part of the plurality of touch electrodes, wherein the scanning signal is a multi-frequency scanning signal or a single-frequency non-sine wave scanning signal;
a touch data acquisition circuit, electrically connected to the plurality of touch electrodes and configured to acquire first touch data and second touch data according to the scanning signal, the first touch data and the second touch data are acquired when scanning the plurality of touch electrodes with the scanning signal of different frequencies; and
a calculation circuit, electrically connected to the touch data acquisition circuit, the touch device defining a plurality of touch nodes, each of the plurality of touch nodes corresponding to the first touch data and the second touch data, the calculation circuit being configured to define any touch node having a difference between the corresponding first touch data and the corresponding second touch data less than a preset difference threshold as a target touch node, and calculate a current touch position according to the first touch data and the second touch data corresponding to the target touch node.

18. A touch device comprising a touch control circuit system and a plurality of touch electrodes, the touch device defining a plurality of touch nodes, the touch control circuit system comprising:
a scanning signal sending circuit, electrically connected to the plurality of touch electrodes and configured to send a scanning signal to all or a part of the plurality of touch electrodes, wherein the scanning signal is a multi-frequency scanning signal or a single-frequency non-sine wave scanning signal;

a touch data acquisition circuit, electrically connected to the plurality of touch electrodes and configured to acquire first touch data and second data touch data according to the scanning signal, the first touch data and the second touch data are acquired when scanning the plurality of touch electrodes with the scanning signal of different frequencies; and a calculation circuit, electrically connected to the touch data acquisition circuit, each of the plurality of touch nodes corresponding to the first touch data and the second touch data, the calculation circuit being configured to define any touch node having a difference between the corresponding first touch data and the corresponding second touch data less than a preset difference threshold as a target touch node, and calculate a current touch position according to the first touch data and the second touch data corresponding to the target touch node.

19. The touch device of claim 18, wherein the touch device is pre-stored with a first touch mode and a second touch mode which different from the first touch mode, and the first touch mode is configured to send a scanning signal to the plurality of touch electrodes, the scanning signal is a multi-frequency scanning signal, acquire first touch data and second touch data according to the scanning signal, the first touch data and the second touch data are respectively acquired when scanning the plurality of touch electrodes with the scanning signal of different frequencies, define a plurality of touch nodes by the touch device, each of the plurality of touch nodes corresponding to one of the first touch data and one of the second touch data, define at least one target touch node according to a difference between the first touch data and the second touch data, and calculate a current touch position according to the first touch data and the second touch data of the at least one target touch node;

the touch device further comprises a switching system, which comprising:

an instruction receiving circuit configured to receive a touch mode setting instruction; and a switching circuit configured to control the touch device to switch to the first touch mode or the second touch mode according to the touch mode setting instruction.

20. The touch device of claim 19, wherein the instruction receiving circuit comprises:

a detection circuit, configured to detect an environmental parameter of a current environment where the touch device is located; and a generating circuit, configured to generate the touch mode setting instruction according to the environmental parameter.

21. The touch device of claim 20, wherein the environmental parameter comprises environmental humidity, when the environmental humidity is judged to be greater than the preset threshold, the switching circuit is configured to control the touch device to switch to the first touch mode according to the setting instruction.

22. The touch device of claim 19, wherein the instruction receiving circuit is configured to generate the setting instruction according to a mode setting operation of a user, and the mode setting operation comprises touching, pushing a button, or voice controlling.

* * * * *